United States Patent
Mensink et al.

(10) Patent No.: US 6,400,933 B1
(45) Date of Patent: Jun. 4, 2002

(54) AMPLIFIER

(75) Inventors: Clemens H. J. Mensink; Johannes P. M. Van Lammeren, both of Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/399,636

(22) Filed: Sep. 20, 1999

(30) Foreign Application Priority Data

Sep. 21, 1998 (EP) .............................................. 98203161

(51) Int. Cl.$^7$ .............................. H04B 1/06; H04B 7/00
(52) U.S. Cl. ................. 455/179.1; 455/232; 455/241.1; 455/245.2; 455/253.2; 330/133
(58) Field of Search .......................... 455/179.1, 241.1, 455/232.1, 253.2, 341, 182.3, 150.1, 192.1, 178.1, 245.2, 184.1, 187.1; 330/133, 134, 305, 278

(56) References Cited

U.S. PATENT DOCUMENTS

| | | | | |
|---|---|---|---|---|
| 3,814,843 A | * | 6/1974 | Kruszewski | 455/192.1 |
| 4,794,343 A | * | 12/1988 | Yang | 330/133 |
| 4,910,478 A | * | 3/1990 | Koyama | 455/241.1 |
| 5,204,977 A | * | 4/1993 | Feldt | 455/241.1 |
| 5,210,504 A | | 5/1993 | Yagita et al. | 330/253 |
| 5,233,634 A | * | 8/1993 | Vaisanen | 455/232.1 |
| 5,388,078 A | * | 2/1995 | Arakawa | 327/102 |
| 5,530,405 A | * | 6/1996 | Rydel | 330/278 |
| 5,638,141 A | * | 6/1997 | Bae et al. | 455/245.2 |
| 5,661,434 A | * | 8/1997 | Brozovich et al. | 330/133 |

FOREIGN PATENT DOCUMENTS

EP 0777334 A2 6/1997

OTHER PUBLICATIONS

Monolithic TV IF System TBA 440, E. Schatter, IEEE Transactions on BTR, vol. 18, Aug. 1972, pp. 158–163.

* cited by examiner

*Primary Examiner*—William Trost
*Assistant Examiner*—Simon Nguyen
(74) *Attorney, Agent, or Firm*—Steven R. Biren

(57) ABSTRACT

An amplifier used in a tuner of video and/or audio equipment has to amplify the received input signal but should add as little as possible noise and distortion to the amplified signal. To improve the operation of the amplifier and includes tuner, the amplifier of the at least two gain stages and switches for short-circuiting a gain stage when it is not necessary for the overall gain value.

15 Claims, 3 Drawing Sheets

AMPLIFIER

BACKGROUND OF THE INVENTION

1. Field of the Invention

This invention relates to a tuner for receiving an input signal and supplying an output signal, comprising and input amplifier, an mixer coupled to the input amplifier for supplying an IF signal, and a multi-stage amplifier for amplifying the IF signal, the multi-stage amplifier comprising a series arrangement of at least two gain stages, and supplying the output signal, and gain control means for controlling the multistage amplifier.

The invention also relates to a cascaded current comparator for use in a multistage amplifier.

2. Description of the Related Art

Such a tuner is known from U.S. Pat. No. 5,210,504. Therein, a tuner is described for satellite broadcasting.

Such a tuner is also known from the article "Monolithic TV IF system TBA 440", E. Schatter, IEEE Transactions on BTR, Vol. 18, August 1972, pages 158–163. In the above-mentioned article, an (IF) amplifier has been described comprising a series arrangement of three gain stages.

A disadvantage of the prior-art tuner is that such a tuner adds noise and distortion to the input signal, especially at a low gain with several gain stages in series.

SUMMARY OF THE INVENTION

An object of the invention is to overcome the disadvantages of the prior-art tuner.

To this end, a first aspect of the invention provides a tuner as described above, characterized in that the multistage amplifier further comprises switching means parallel to the gain stages for shunting at least one of the gain stage.

A second aspect of the invention provides a multi-stage amplifier for use in a tuner as described above. By shunting the unnecessary gain stage/stages, the problem of the tuners and/or amplifiers of the prior art are overcome.

A third aspect of the invention provides a cascaded current comparator for use in a multi-stage amplifier as described above, in which inactive stages are turned off. By turning off inactive stages, current dissipation is reduced resulting in a low-power cascaded current comparator.

An embodiment of a tuner according to the invention in which the multi-stage amplifier comprises at least three gain stages arranged in a series.

By using three gain stages the necessary gain range can be easily obtained, and at the same time the complexity of the amplifier is kept within reasonable proportions.

An embodiment of a tuner according to the invention, characterized in that the switching means comprises a switch coupled in parallel with at least two gain stages.

By short-circuiting at least two gain stages together for the low gain range the distortion is further reduced.

An embodiment of a multistage amplifier according to the invention is characterized in that the multistage amplifier comprises a cascaded current comparator for generating tuning signal for the gain stages.

In this way a so-called thermometer code is obtained for supplying the tuning voltages of the gain stages.

BRIEF DESCRIPTION OF THE DRAWINGS

The invention and additional features, which may optionally be used to implement the invention to advantage, will be apparent from and elucidated with reference to the accompanying drawings, in which.

DESCRIPTION OF THE PREFERRED EMBODIMENTS

Figure 1:
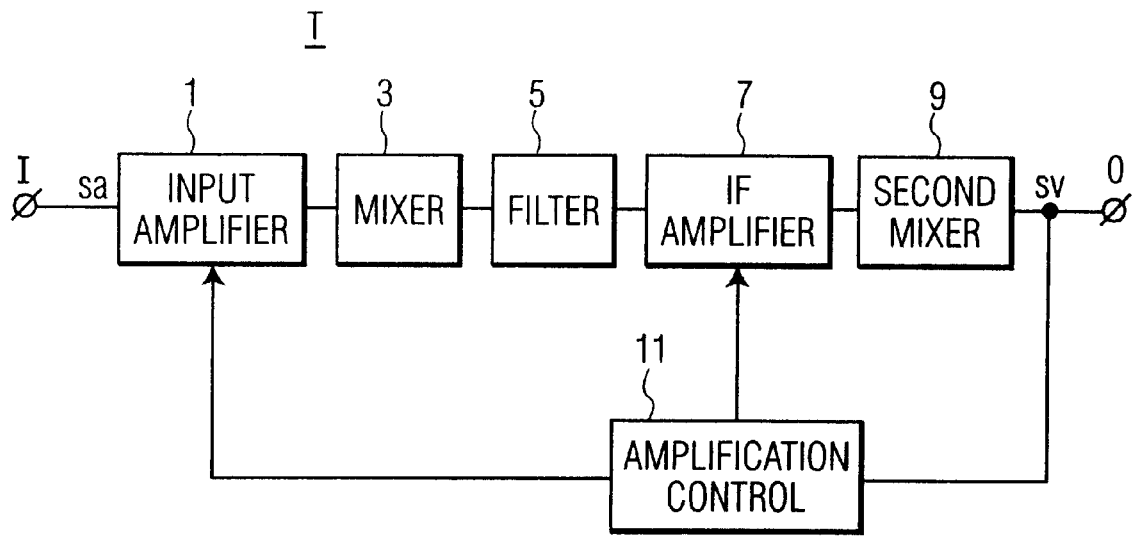
FIG. 1 shows a schematic embodiment of a tuner according to the invention.

FIG. 1 shows, by way of example, a schematic embodiment of a tuner T according to the invention, comprising an input I and an output O. The input is coupled to an input amplifier 1, for amplifying the received antenna signal sa. The output of the input amplifier is coupled to a mixer 3 for obtaining a so-called IF signal. This IF signal, after filtering in a filter 5, is supplied to an IF amplifier 7, arranged as a multi-stage. After amplification in the IF amplifier, the IF signal is further supplied to a second mixer 9 for obtaining a baseband video signal sv at the output O. The video signal sv is supplied to control means 11 for controlling the amplification of the input amplifier 1 and of the IF amplifier 7 in this example.

Figure 2:
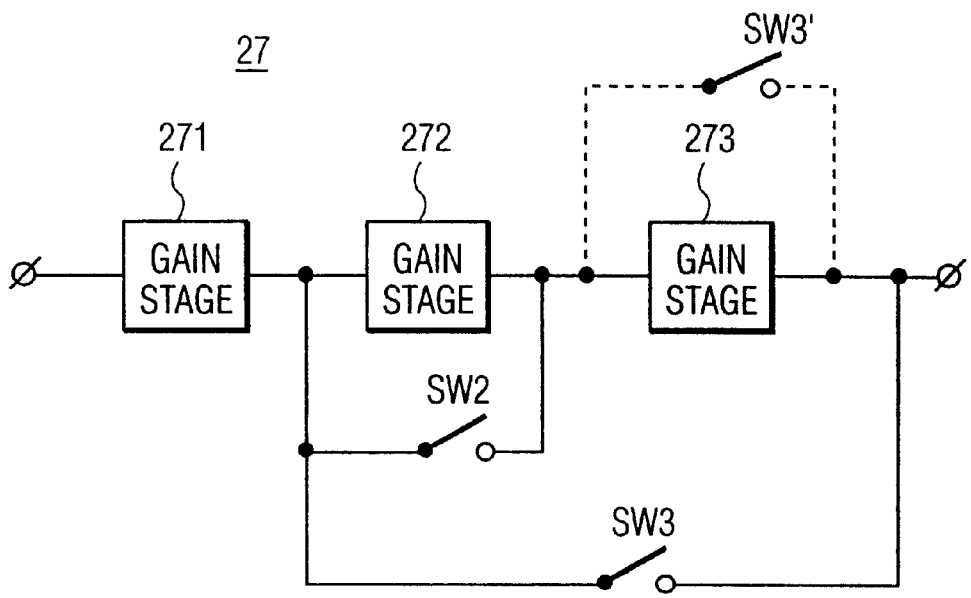
FIG. 2 shows a schematic embodiment of an IF amplifier according to the invention.

FIG. 2 shows, by way of example, a schematic embodiment of a multi-stage amplifier 27. In this embodiment the multi-stage amplifier comprises three gain stages 271, 272 and 273. Further, the IF amplifier including a switch SW2 arranged in parallel to the second gain stage 272, and a switch SW3 arranged in parallel to the second gain stage 272 and the third gain stage 273.

Alternatively, switch SW3' could be arranged to shunt only the third gain stage 273. It is to be noted here that the multi-stage amplifier 27 can be an IF amplifier (see FIG. 1, reference numeral 7), or a baseband amplifier. The multi-stage amplifier can further be used for video or audio signals.

For strong antenna signals the gain of the multi-stage amplifier, in this embodiment, is equal to 0.5 (−6 dB) whereas for weak signals the gain can increase up to 2000 (66 dB). The large gain range is established in this example, by three cascaded gain stages. Each gain stage adds noise and distortion to the output signal, which lowers the overall dynamic range at low gain values.

However, at low gain values, only one gain stage is needed for the amplification, and the other two can be shunted. In this concept, gain stages are shunted if they are not needed for the amplification resulting in a higher dynamic range. Furthermore, by a proper way of controlling the gain stages, the distortion requirements for the intermediate gain stage(s) can be relaxed significantly.

In order to establish a certain dynamic range and keep the power as low as possible, noise of the amplifier must be as low as possible. In the following, the output noise will be analyzed. Let us assume that the switches SW2 and SW3 are open; then the mean square output noise voltage is given by:

$$\overline{v_{nout}^2} = (G1*G2*G3)^2 * \overline{v_{n271}^2} + (G2*G3)^2 * \overline{v_{n272}^2} + (G3)^2 \overline{v_{n273}^2}$$

In the above equation, G1, G2 and G3 are the gains of stages 271, 272 and 273, respectively. The noise voltage of the gain stages is referred to the input. If the gains of 271, 272 and 273 are low, for example, G1=G2=G3=1, and all three stages are identical, the noise contribution to the output noise is the same for every stage. However, in this case, the stage 272 and 273 are not needed for the amplification. Consequently, shunting the stages 272 and 273 will lower the output noise and does not affect the overall gain since G2=G3=1. This relaxes the noise requirements for all three stages significantly. For a given dynamic range, stage 271 is allowed to produce more noise since stage 272 and 273 do not contribute to the output noise. Moreover, the noise power of the stage 272 and 273 might increase as long as the noise power is negligible compared to $$G_{1ma}^2 * \overline{V^2_{n271}}$$

resulting in the same overall output noise.

Because the shunt switches won't be open as long as 271 has not reached its maximum gain, the higher allowable output noise of the stages can result in a lower power consumption.

If the shunt switches SW2 and SW3 are closed, not only the noise is reduced, but also, the distortion due to stages 272 and 273 is lowered. It is clear that stage 273 has to handle the maximum output voltage, however, this is not obvious for stage 272. If the gain of stage 273 increases before the gain of stage 272, the maximum output signal of stage 272, as stage 272 is open, will be reduced by a factor G3max. As a result of this, the distortion requirement for stage 272 has been relaxed significantly.

Figure 3:
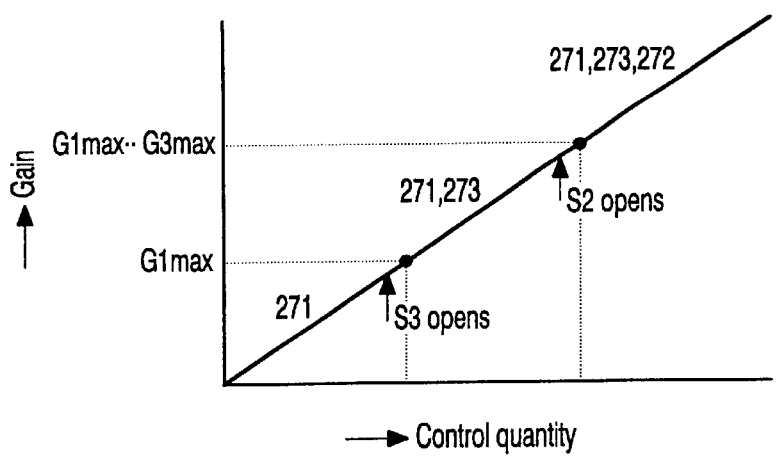
FIG. 3 graphically shows the overall gain versus the gain control quantity.

FIG. 3 shows the establishment of the overall gain versus the gain control quantity. This quantity is a voltage or a current whose value is determined by the control means. For low gain, only stage 271 is active and the shunt switches are closed. Just before stage 273 is activated, switch SW3 opens. At this point, the voltage across switch SW3 is ideally zero since the gain of stage 273 is equal to 1, and switch SW2 is closed. Hence, the output signal will not be distributed due to switching of switch SW3. If stage 273 is close to its maximum value G3max, switch SW2 opens and stage 272 will increase the overall gain. During switching of switch SW2, the output signal will not be disturbed since G2=1.

Although the IF amplifier in this embodiment has one intermediate stage, in general, more intermediate stages can be provided.

The requirements for the first stage are relatively high in this embodiment. Nevertheless, they are lower than the requirements in the situation wherein no switches are used. Most of the power will be consumed by the first stage. The intermediate stage, on the other hand, can be a very relaxed design with respect to the noise and linearity.

Figure 4:
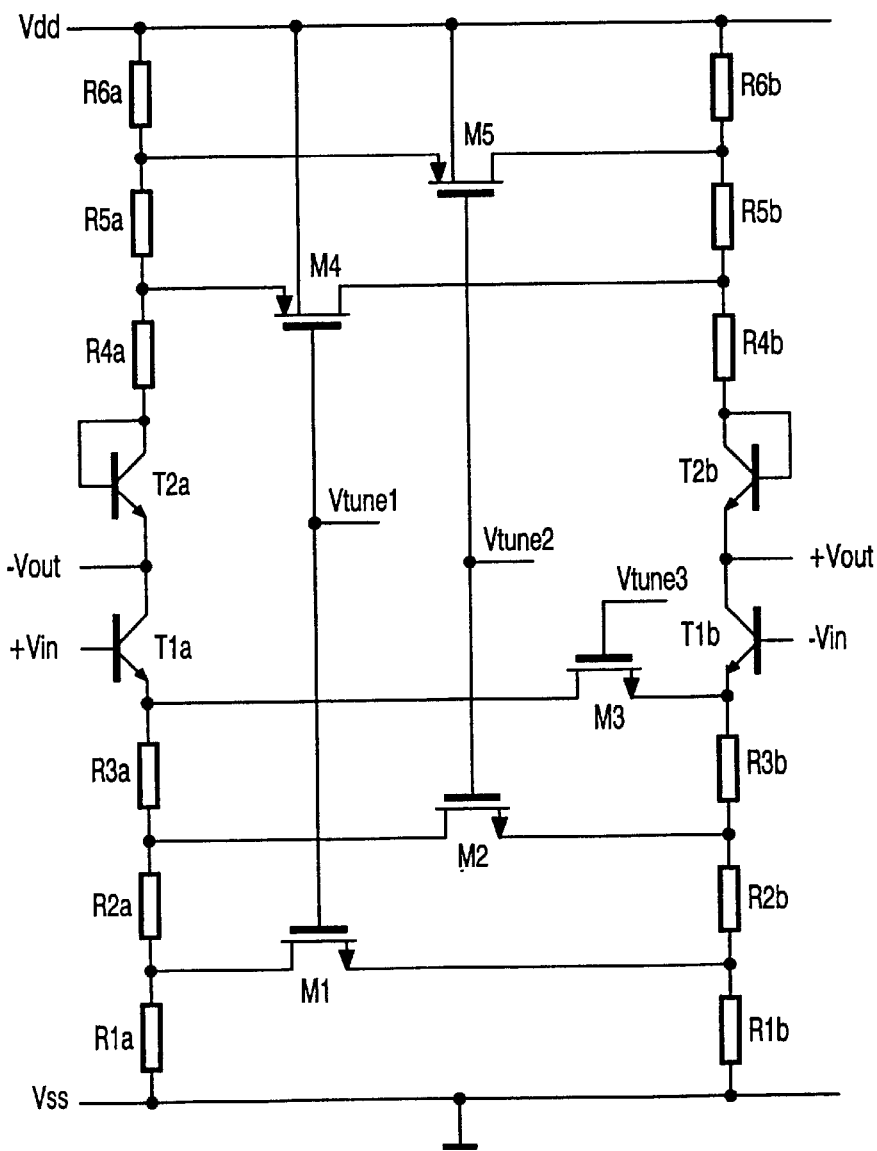
FIG. 4 shows an embodiment of a circuit of a gain stage.

FIG. 4 shows an example of the circuit diagram of a gain stage 47x. All gain stages are based on the same principle. It consists of a resistor degenerated differential pair terminated with resistors. The differential input voltage (Vin, −Vin) is supplied via transistors T1a, T1b, respectively. The differential output voltage (Vout, −Vout) is supplied at the connection point of transistors T1a, T2a; T1b, T2b, respectively. Both the degeneration resistance (R1a, R2a, R3a; R1b, R2b, R3b) and the termination resistance (R4a, R5a, R6a; R4b, R5b, R6b) are adjustable with MOS transistors.

In numerical order, the tune voltages Vtune (Vtune1, Vtune2, Vtune3) vary gradually from a low potential (0V) to a high potential (4V). In this way the MOS transistors are 'soft-switched' and the gain increases gradually. Alternatively, all the tune voltages can be connected to one node; in this way, the MOS transistors can still be 'soft-switched' in the correct order due to the different source (or drain) voltages. An advantage of this gain stage is the relatively low noise performance. The differential mean square noise voltage of the degeneration or termination network is equal to 4*k*T*Reffdf, where Reff is the effective resistance of the network. Such a gain stage has been described in Application EP-A-0836766, in corresponding to U.S. Pat. No. 5,828,265, assigned to U.S. Philips Corp. the (PHN15802). This patent application and corresponding applications are incorporated herein by reference.

For the stages 272 and 273, the gain is preferably exactly equal to 1 if the shunt switches are closed. For this reason, transistors T2a and T2b are added, in this example, to compensate for the finite transductance of T1a and T1b as well as for the distortion and temperature variations.

Because of the different requirements with respect to noise and distortion, the gain stages can be individually optimized. The degeneration and termination resistance of the first stage is determined by the noise requirements. The total resistance of the second and the third stages is determined by the frequency behavior. The resistance of these stages might increase with respect to the noise requirements, but it will result in a lower cut-off frequency. The number of applied 'soft-switches' is determined by the distortion requirements. In the first stage, for example, eleven 'soft-switches' are used, whereas in the second stage, for example, only two 'soft-switches' are needed (in EP-A-0836766 this has been described in more detail).

The applied shunt switch consists basically of a NMOS transistor. As mentioned before, the voltage drop across a shunt switch must be as small as possible to keep the distortion low during switching. Therefore, the gain of the second (272) and the third (273) stage must be preferably very close to 1, and the phase-shift must be preferably close to zero. However, even if the voltage drop across the switch is zero, the switch still introduces distortion due to the non-linear gate-source capacitance, which at its worst if Vgs is close to the Vt. To reduce the signal voltage across the gate source, the gate is coupled by a capacitor to the source.

Figure 5:
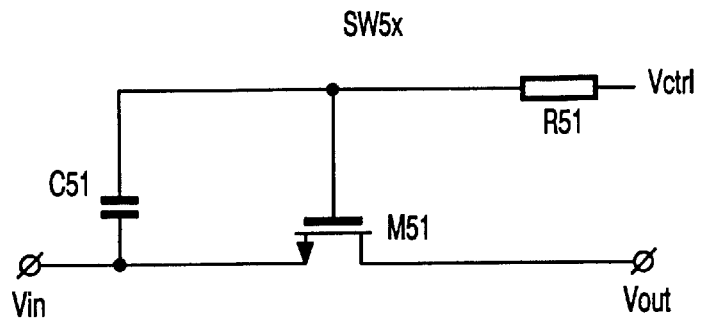
FIG. 5 shows an embodiment of a switch.

FIG. 5 shows a simplified circuit diagram of a (shunt-) switch SW5x comprising a MOS transistor M51, a capacitor C51 and a resistor R51, controlled by a control signal Vctrl. The terminals of the main current path of the MOS transistor M51 are denoted Vin and Vout. In the embodiment shown in FIG. 2, the shunt switch SW2 is connected with its Vin terminal to the input of the gain stage 272, and with its Vout terminal to the output of the gain stage 272. In the same way, the shunt switches SW3 and SW3' are arranged between the inputs and outputs of the series arrangement of the gain stages 272 and 273, and the gain stage 273, respectively.

In the embodiment of a gain stage as shown in FIG. 4, two shunt switches are required. A first shunt switch receives the input voltage +Vin on its Vin terminal and is connected with its output terminal Vout to the node supplying +Vout. A second shunt switch receives the input voltage −Vin on its Vin terminal and is connected with its output terminal Vout to the node supplying −Vout. Special provisions may be needed to ensure the proper DC levels of the input and output voltages +Vin, −Vin, +Vout and −Vout.

If the tune voltages in FIG. 4 are not connected to one node, a thermometer code is needed to generate the appropriate signals. Cascaded current comparators (see FIG. 6) generate this thermometer code.

Figure 6:
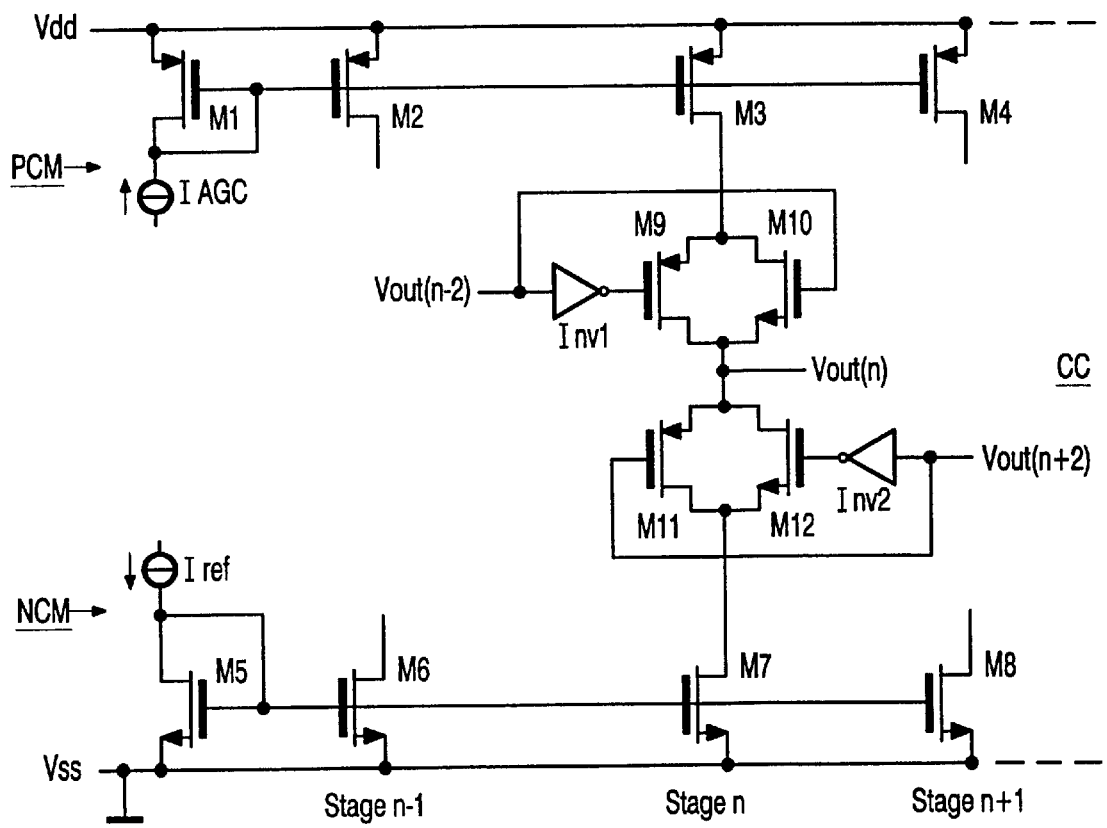
FIG. 6 shows an embodiment of a comparator.

FIG. 6 shows one stage of the multi-stage current comparator CC. This comparator can be used to generate the appropriate signals for the gain control and shunt switches in order to achieve very low distortion levels. Total current consumption of the comparator can be rather low because only the actual current stages, for a specific input current, are turned on. Let us assume that the transistors M9 and M12 are in the conducting state. The current comparator consists of two current mirrors. The output currents of the PMOS current mirror (PCM, comprising M1, M2, M3, M4, M9, M10 and Inv1) are equal and controlled by the control means (11, FIG. 1). The output currents of the NMOS current mirror (NCM, comprising M5, M6, M7, M8, M11, M12 and Inv2),or PMOS mirror, are weighted and the NMOS mirror is not weighted, or a combination of this, in such a way that the output voltage of stage n varies from Vss to Vdd after stage n−1 and before stage n+1, for increasing values of IAGC.

If a current stage does not have to make a decision, that is, as long as the output voltage does not have to change, the current through this stage can be reduced to zero in order to save power. Hence, current flows through the stage only when the stage needs to be active. To achieve this, stage n−2 activates stage n when its output voltage goes up and stage n+2 deactivates stage n when its output voltage goes up. Note that instead of stage n−2 and n+2 also stage n−1 and n+1 could be used to activate and deactivate stage n.

For a correct operation of the current stages as described above, transistor M10 and M11 are not needed. However, the output voltage of a current stage drives two MOS transistors in a gain stage (FIG. 4). In order to enable the gain to vary gradually, the MOS transistors need to be, preferably, softly, switched. Therefore, the slope of the output voltage of a current stage versus the input current (Iagc) is of interest. For stage n, this slope is mainly determined by the output resistance of the PMOS current-source M3 in parallel with the output resistance of the NMOS current source M7. At certain output voltages, transistor M9 and M12 can operate as cascode transistors resulting in a strongly varying output resistance. Thanks to M10 and M11, the output resistance of the PMOS and NMOS current source are in parallel at any value of the output voltage. As a consequence, the above-mentioned slope remains constant.

The output voltage Vout (n) of the multi-stage current comparator CC is used as one of the tune voltages Vtune1, Vtune2, Vtune3 as shown in the embodiment of FIG. 4. The gain stage 47x exhibits its lowest amplification factor when all the tune voltages Vtune1, Vtune2 and Vtune3 are low: The transistors M1, M2 and M3 are non-conductive and the transistors M4 and M5 are conductive.

The control voltage Vctrl of the shunt switches (SW5x) may also be generated by the multi-stage current comparator CC. At the instant Vtune3 became low, Vctrl has to be become high to activate the shunt switches, such that the terminal receiving the input voltage +Vin is connected to the node supplying the output voltage +Vout, and the terminal receiving the input voltage −Vin is connected to the node supplying the output voltage −Vout.

It is to be noted that hereinabove the invention has been described on the basis of some examples. As mentioned before, the amplifier of the invention can be used at different places, for example, as an IF amplifier for video or audio signals in a tuner, or as an amplifier of a baseband video or audio signal.

What is claimed is:

1. A tuner for receiving an input signal and for supplying an output signal, said tuner comprising an input amplifier, a mixer coupled to the input amplifier for supplying an IF signal, and a multi-stage amplifier for amplifying the IF signal and for supplying the output signal, the multi-stage amplifier comprising:
   a series arrangement of at least two gain stages;
   gain control means for controlling the multi-stage amplifier; and comprising
      switching means arranged in parallel with the gain stages for shunting at least one of the gain stages independently of the supply of an operating voltage to the at least one gain stage.

2. The tuner as claimed in claim 1, characterized in that the multi-stage amplifier comprises at least three gain stages arranged in series.

3. The tuner as claimed in claim 2, characterized in that the switching means comprises a switch coupled in parallel with at least two of said at least three gain stages.

4. The tuner as claimed in claim 1 wherein the series arrangement of at least two gain stages comprises first, second and third series connected gain stages coupled between an input terminal and an output terminal of the multi-stage amplifier, and the switching means comprise;
   a first transistor switching device coupled in parallel with the second gain stage, and
   a second transistor switching device coupled across the second and third series connected gain stages.

5. The tuner as claimed in claim 4 wherein the gain control means further comprises a control circuit having an input coupled to an output of the tuner for supplying a first control signal to the input amplifier and second and third control signals to the first and second transistor switching devices for operation thereof as a function of the level of output voltage at the output of the tuner.

6. The tuner as claimed in claim 1 wherein the gain control means gate further comprises a control circuit having an input for receiving a signal determined by an output signal of the multi-stage amplifier and having output means for controlling the switching operation of the switching means.

7. A multi-stage amplifier for amplifying an input signal, said multi-stage amplifier comprising:
   a series arrangement of at least two gain stages;
   gain control means for controlling the multi-stage amplifier; and comprising
      switching means arranged in parallel with the gain stages for shunting at least one of said gain stages in response to a control signal and independently of the frequency of the input signal.

8. The multi-stage amplifier as claimed in claim 7 which further comprises a cascaded current comparator for generating individual tuning signals for the gain stages.

9. A cascaded current comparator for use in a multi-stage amplifier as claimed in claim 8, characterized in that the cascaded current comparator comprises means for turning off inactive gain stages.

10. The multi-stage amplifier as claimed in claim 7 wherein the switching means comprise an MOS transistor connected between an input terminal and an output terminal of at least one gain stage,
    means for coupling, via an impedance element, a gate electrode of the MOS transistor to a control terminal for said control signal, and
    a capacitor coupled between the gate electrode and a source electrode of the MOS transistor.

11. The multi-stage amplifier as claimed in claim 7 wherein the series arrangement of at least two gain stages comprises first, second and third series connected gain stages coupled between an input terminal and an output terminal of the multi-stage amplifier, and the switching means comprise;

a first transistor switching device coupled in parallel with the second gain stage, and a second transistor switching device coupled across the second and third series connected gain stages.

12. The multi-stage amplifier as claimed in claim 11 wherein the gain control means further comprises a control circuit that controls the order in which the first and second transistor switching devices are operated as a function of the overall power level of the multi-stage amplifier.

13. The multi-stage amplifier as claimed in claim 7 wherein the switching means comprise at least one ungrounded switching device coupled in parallel with said at least one gain stage.

14. The multi-stage amplifier as claimed in claim 7 wherein the switching means comprise at least one switching device coupled in parallel with said at least one gain stage, and the control signal closes said one switching device independently of the supply of operating voltage to the one gain stage.

15. The multi-stage amplifier as claimed in claim 7 wherein the gain control means further comprises a control circuit having an input for receiving a signal determined by an output signal of the multi-stage amplifier and having output means for controlling the switching operation of the switching means.

\* \* \* \* \*